United States Patent
Cheng

(10) Patent No.: US 12,100,615 B2
(45) Date of Patent: Sep. 24, 2024

(54) METHOD OF MANUFACTURING SEMICONDUCTOR DEVICE

(71) Applicant: NANYA TECHNOLOGY CORPORATION, New Taipei (TW)

(72) Inventor: Min-Chung Cheng, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 224 days.

(21) Appl. No.: 17/645,749

(22) Filed: Dec. 23, 2021

(65) Prior Publication Data
US 2023/0207380 A1 Jun. 29, 2023

(51) Int. Cl.
*H01L 21/762* (2006.01)

(52) U.S. Cl.
CPC .. *H01L 21/76224* (2013.01); *H01L 21/76256* (2013.01)

(58) Field of Classification Search
CPC ......... H01L 21/76808; H01L 21/76813; H01L 21/76825; H01L 21/76829; H01L 21/76838; H01L 21/76224; H01L 21/76816; H01L 21/76824; H01L 21/3065; H01L 21/31138; H01L 21/31144; H01L 21/31056; H01L 21/311; H01L 21/31105; H01L 21/31111; H01L 21/31116; H01L 21/76807; H01L 21/76814; H01L 21/76832; H01L 21/76835; H01L 21/0276; H01L 21/02063; H01L 21/76802
See application file for complete search history.

(56) References Cited

U.S. PATENT DOCUMENTS

| | | | |
|---|---|---|---|
| 2004/0121581 A1* | 6/2004 | Ali | H01L 21/76808 438/622 |
| 2007/0218679 A1* | 9/2007 | Schneider | H01L 21/76829 257/E21.256 |
| 2007/0224825 A1* | 9/2007 | Xiao | H01L 21/31138 257/E21.256 |
| 2008/0020570 A1* | 1/2008 | Naik | H01L 21/76808 438/675 |
| 2010/0015550 A1 | 1/2010 | Liu et al. | |
| 2020/0365451 A1 | 11/2020 | Tien et al. | |

FOREIGN PATENT DOCUMENTS

KR 20130046812 A * 5/2013 ......... H01L 21/0337

OTHER PUBLICATIONS

Min, KR20130046812 A, English Translation.*

* cited by examiner

*Primary Examiner* — Latanya N Crawford Eason
(74) *Attorney, Agent, or Firm* — CKC & Partners Co., LLC

(57) ABSTRACT

The present disclosure provides a method of manufacturing a semiconductor device. The method includes: filling a trench of a stacking structure with a bottom anti-reflection coated material to form a dummy via in the trench, in which the stacking structure includes a low-k material layer and a cap layer, and the trench runs through the low-k material layer and the cap layer; and etching the dummy via by performing a first etching process and a second etching process.

12 Claims, 5 Drawing Sheets

100 filling a trench of a stacking structure with a BARC material to form a via in the trench, in which the stacking structure includes a low-k material layer and a cap layer, and the trench runs through the low-k material layer and the cap layer ~110 etching the via ~120

```
┌─────────────────────────────────────────────────┐
│ filling a trench of a stacking structure with a BARC │
│ material to form a via in the trench, in which the  │
│ stacking structure includes a low-k material layer  │──110
│ and a cap layer, and the trench runs through the    │
│ low-k material layer and the cap layer              │
└─────────────────────────────────────────────────┘
                        │
                        ▼
┌─────────────────────────────────────────────────┐
│  ┌───────────────────────────────────────────┐  │
│  │ performing a first etching process to etch the via │──121
│  └───────────────────────────────────────────┘  │
│                       │                          │──120
│                       ▼                          │
│  ┌───────────────────────────────────────────┐  │
│  │ performing a second etching process to maintain a │──122
│  │ critical dimension of the via             │  │
│  └───────────────────────────────────────────┘  │
└─────────────────────────────────────────────────┘
```

FIG. 2

METHOD OF MANUFACTURING SEMICONDUCTOR DEVICE

BACKGROUND

Field of Invention

The present invention relates to a method of manufacturing a semiconductor device.

Description of Related Art

Semiconductor industries are developing and improving the manufacturing process for semiconductor structures, while the miniaturization of components continues. The accuracy of the scale and shape of the structure required to reduce its resistivity has thus become more important. For instance, a metal-2 (M2) trench with a particular critical dimension of back-end-of-line (BEOL) included in a semiconductor structure is required. However, a fencing problem that may deteriorate the electrical performance of the semiconductor device may occur during the traditional etching processes of M2 trench. Therefore, a suitable prescription for manufacturing a semiconductor device with satisfying performance is necessary and indispensable.

SUMMARY

In view of this, one purpose of present disclosure is to provide a method of manufacturing a semiconductor device that can solve the aforementioned problems.

In order to achieve the above objective, according to an embodiment of the present disclosure, a method of manufacturing a semiconductor device includes: filling a trench of a stacking structure with a BARC material to form a dummy via in the trench, in which the stacking structure includes a low-k material layer and a cap layer, and the trench runs through the low-k material layer and the cap layer; and etching the dummy via by performing a first etching process and a second etching process.

In one or more embodiments of the present disclosure, in which performing the first etching process etches a first portion of the dummy via.

In one or more embodiments of the present disclosure, in which performing the second etching process etches a second portion of the dummy via.

In one or more embodiments of the present disclosure, in which a depth of the etched dummy via is equal to or less than 200 nm.

In one or more embodiments of the present disclosure, in which performing the first etching process uses a first etching gas.

In one or more embodiments of the present disclosure, in which the first etching gas includes $CHF_3$ and $O_2$.

In one or more embodiments of the present disclosure, in which a volume ratio of $CHF_3$ to $O_2$ is 3:1.

In one or more embodiments of the present disclosure, in which performing the second etching process uses a second etching gas.

In one or more embodiments of the present disclosure, in which the second etching gas includes $H_2$ and $N_2$.

In one or more embodiments of the present disclosure, in which a volume ratio of $H_2$ to $N_2$ is 1:1.

In one or more embodiments of the present disclosure, in which etching the dummy via is performed after filling the trench of the stacking structure.

In one or more embodiments of the present disclosure, in which the first etching process is performed after the second etching process.

In summary, the method of manufacturing the semiconductor device solves the fencing problem of the conventional method during M2 trench etching, so that the semiconductor device has higher quality dummy vias, thereby reducing resistivity and improving its electrical performance.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIG. 1 is a flow chart of a method of manufacturing a semiconductor device in accordance with an embodiment of present disclosure;

FIG. 2 is a flow chart of another method of manufacturing the semiconductor device in accordance with an embodiment of present disclosure;

DETAILED DESCRIPTION

Figure 3:
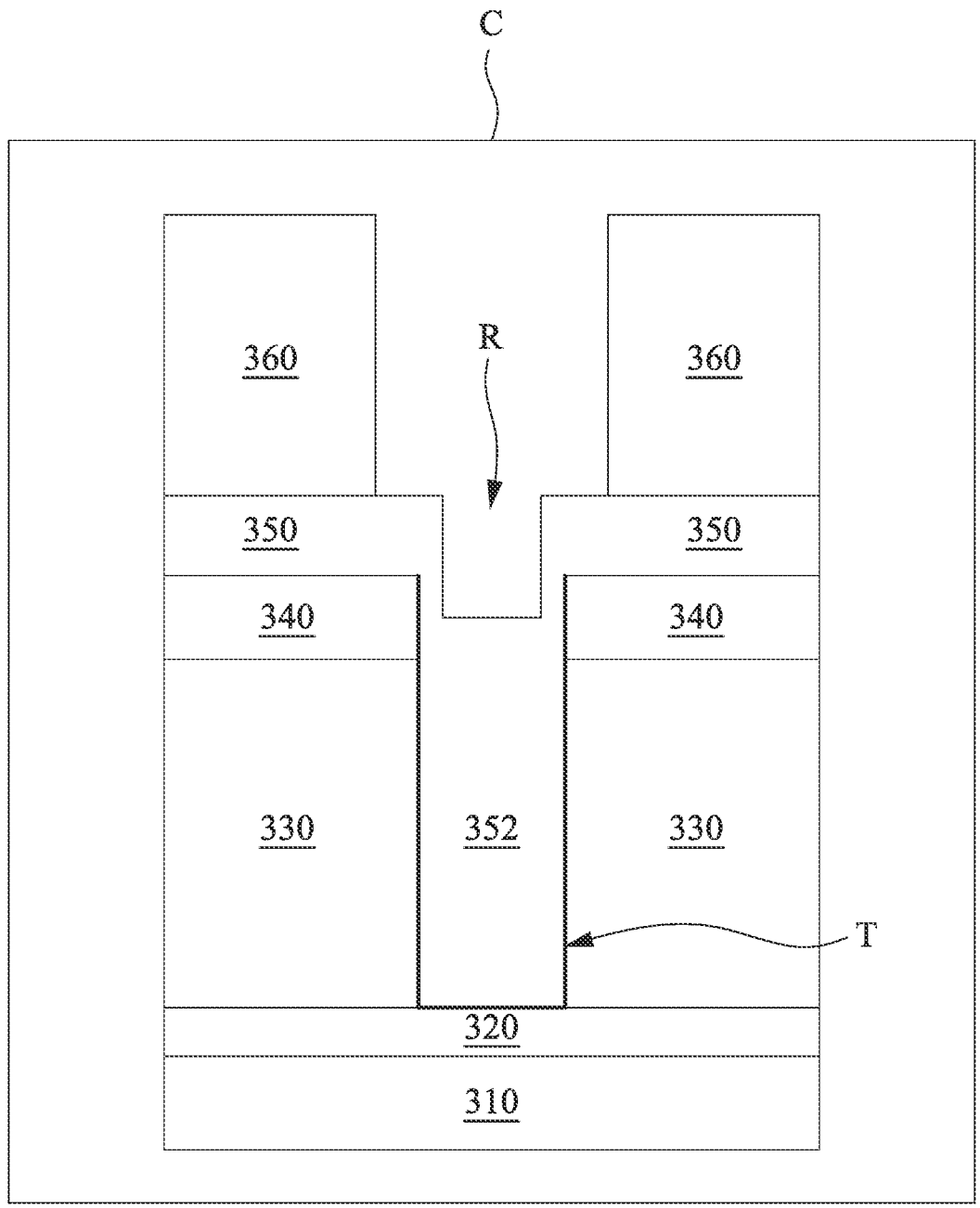
FIG. 3 is a schematic view of an intermediate stage of manufacturing a semiconductor device in accordance with an embodiment of present disclosure.

Reference will now be made in detail to the present embodiments of the invention, examples of which are illustrated in the accompanying drawings. Wherever possible, the same reference numbers are used in the drawings and the description to refer to the same or like parts.

Reference is made to FIG. 1. FIG. 1 is a flow chart of a method 100 of manufacturing a semiconductor device in accordance with an embodiment of present disclosure. The method 100 shown in FIG. 1 includes a step S110 and a step S120. Please refer to FIG. 1 and FIG. 3 for better understanding the step S110, and refer to FIG. 1 and FIG. 5 for better understanding the step S120.

Reference is made to FIG. 3. FIG. 3 is a schematic view of an intermediate stage of manufacturing a semiconductor device 300 in accordance with an embodiment of present disclosure. As shown in FIG. 3, a substrate 310 is provided. A barrier layer 320 is formed over the substrate 310. A dielectric layer 330 is formed over the barrier layer 320. A cap layer 340 is formed over the dielectric layer 330. A bottom anti-reflection coated (BARC) layer 350 is formed over the cap layer 340. A dummy via 352 runs through the dielectric layer 330 and the cap layer 340, and is formed from the BARC layer 350. Specifically, the dummy via 352 is a portion of the BARC layer 350. The BARC layer 350 and the dummy via 352 are formed together by a deposition process and fill a trench T running through the dielectric layer 330 and the cap layer 340. In some embodiments, the BARC layer 350 and the dummy via 352 are formed like a generally T-shape, as shown in FIG. 3. A photoresist layer 360 is formed over the BARC layer 350. As shown in FIG.

3, the photoresist layer 360 is patterned by a photolithography process and thus forms a hollowed portion therein. For example, the hollowed portion is formed in the center of the photoresist layer 360. In some embodiments, the hollowed portion is formed over the dummy via 352.

In some embodiments, as shown in FIG. 3, a recess R may be formed through the BARC layer 350 and the dummy via 352, but the present disclosure is not limited thereto. In some embodiments, the recess R may not be formed in the structure shown in FIG. 3.

In some embodiments, the recess R may be formed by performing an etch process. The present disclosure is not intended to limit the methods of forming the recess R.

In some embodiments, the substrate 310 may include a material, such as copper. However, any suitable material may be utilized.

In some embodiments, the substrate 310 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the substrate 310.

In some embodiments, the barrier layer 320 may be a BLoK (barrier low-k) film. The barrier layer 320 is formed as a landing pad for depositing the dummy via 352.

In some embodiments, the barrier layer 320 may include a low-k material, such as SiOSCH, TiN, or SiC. However, any suitable material may be utilized.

In some embodiments, the barrier layer 320 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the barrier layer 320.

In some embodiments, a thickness of the barrier layer 320 is about 40 nm. The present disclosure is not intended to limit the size of the barrier layer 320.

In some embodiments, the dielectric layer 330 may include a low-k material, such as silicon oxide, silicon nitride, or silicon oxynitride. However, any suitable material may be utilized.

In some embodiments, the dielectric layer 330 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the dielectric layer 330.

In some embodiments, a thickness of the dielectric layer 330 is about 500 nm. The present disclosure is not intended to limit the size of the dielectric layer 330.

In some embodiments, the cap layer 340 may include a material, such as silicon oxide, silicon nitride, or silicon oxynitride. However, any suitable material may be utilized.

In some embodiments, the cap layer 340 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the cap layer 340.

In some embodiments, a thickness of the cap layer 340 is about 100 nm. The present disclosure is not intended to limit the size of the cap layer 340.

In some embodiments, the BARC layer 350 may include a material, such as crosslinked resin, surface-active chemical agent, or solvent. However, any suitable material may be utilized.

In some embodiments, the BARC layer 350 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the BARC layer 350.

In some embodiments, a thickness of the BARC layer 350 is about 100 nm. The present disclosure is not intended to limit the size of the BARC layer 350.

In some embodiments, the photoresist layer 360 may include a material, such as nitrides and oxides. However, any suitable material may be utilized.

In some embodiments, the photoresist layer 360 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the photoresist layer 360.

In some embodiments, a thickness of the photoresist layer 360 is about 380 nm. The present disclosure is not intended to limit the size of the photoresist layer 360.

Step S110 and step S120 are described in detail below.

In Step S110, a trench of a stacking structure is filled with a BARC material to form a dummy via in the trench, in which the stacking structure includes a low-k material layer and a cap layer, and the trench runs through the low-k material layer and the cap layer.

In some embodiments, the stacking structure includes the substrate 110, the barrier layer 320, the dielectric layer 330, the cap layer 340, the BARC layer 350, and the patterned photoresist layer 360, in which a trench T of the stacking structure runs through the dielectric layer 330 and the cap layer 340, as shown in FIG. 3.

In some embodiments, the aforementioned stacking structure is provided in a chamber C, as shown in FIG. 3. The chamber C is configured for performing the processes included in the method 100 shown in FIG. 1.

In Step S120, the dummy via is etched by an etching process.

Figure 5:
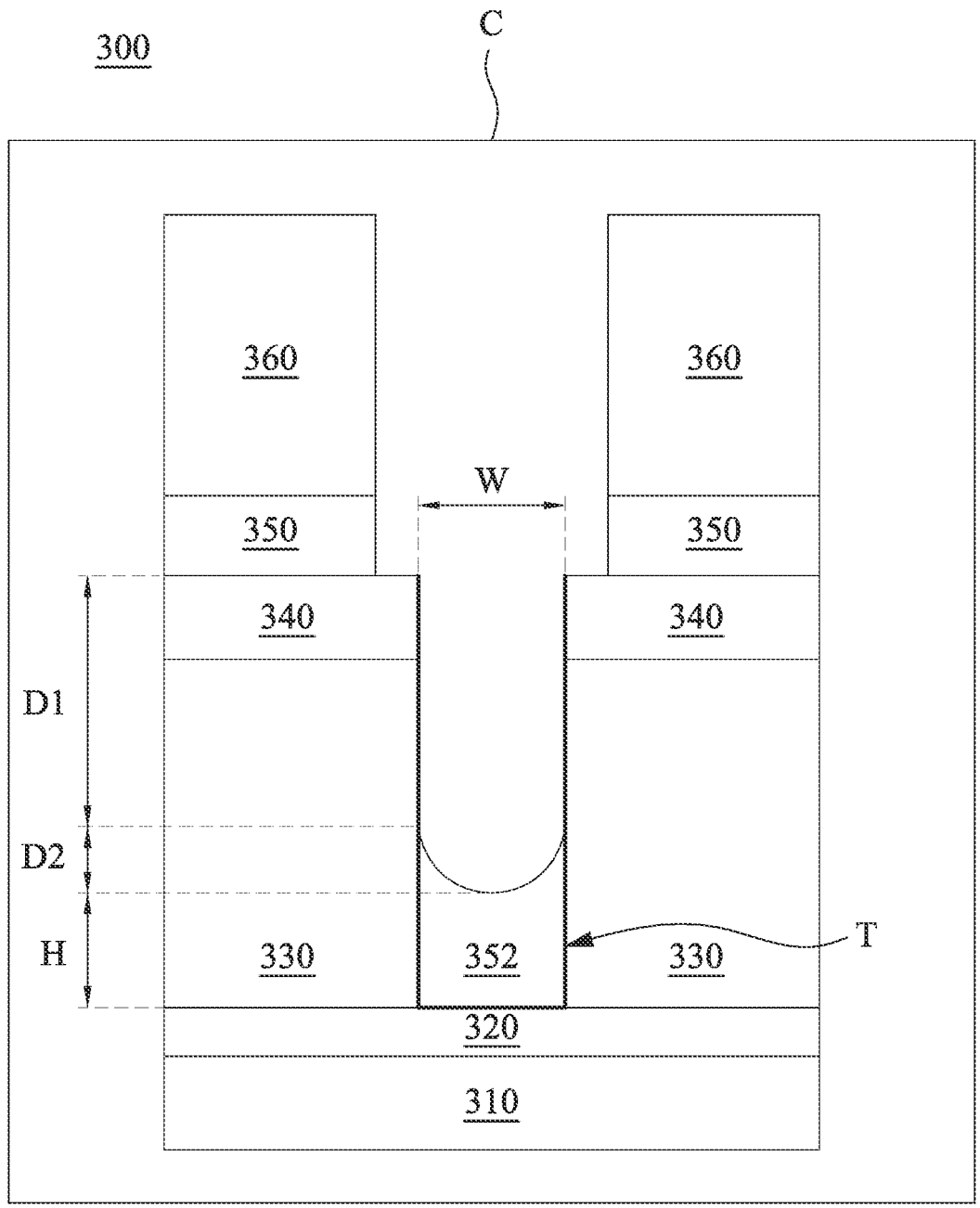
FIG. 5 is a schematic view of an intermediate stage of manufacturing the semiconductor device in accordance with an embodiment of present disclosure.

Reference is made to FIGS. 1 and 5. FIG. 5 is a schematic view of an intermediate stage of manufacturing a semiconductor device 300 in accordance with an embodiment of the present disclosure. The semiconductor device 300 includes the etched dummy via 352 filling the trench T. As shown in FIG. 5, the dummy via 352 is etched after performing the etching process of step S120. Specifically, the etching process using etching gas is performed to etch the dummy via with a critical dimension (for example, a width). This ensures that the resistivity of the semiconductor device 300 can be reduced after performing the etching process of step S120.

In some embodiments, the etching process in step S120 may be dry etching or wet etching. The present disclosure is not intended to limit the way of etching the dummy via 352.

By performing the method 100 shown in FIG. 1 of the present disclosure, the semiconductor device 300 with better electrical performance may be formed.

Reference is made to FIG. 2. FIG. 2 is another flow chart of the method 100 of manufacturing the semiconductor device 300 in accordance with an embodiment of present disclosure. As shown in FIG. 2, step S120 further includes step S121 and step S122. Please refer to FIGS. 2 and 3 for better understanding steps S110, and refer to FIGS. 2, 4, and 5 for better understanding step S121 and step S122.

Step S121 and step S122 are described in detail below.

In Step S121, a first etching process is performed to etch the dummy via.

Figure 4:
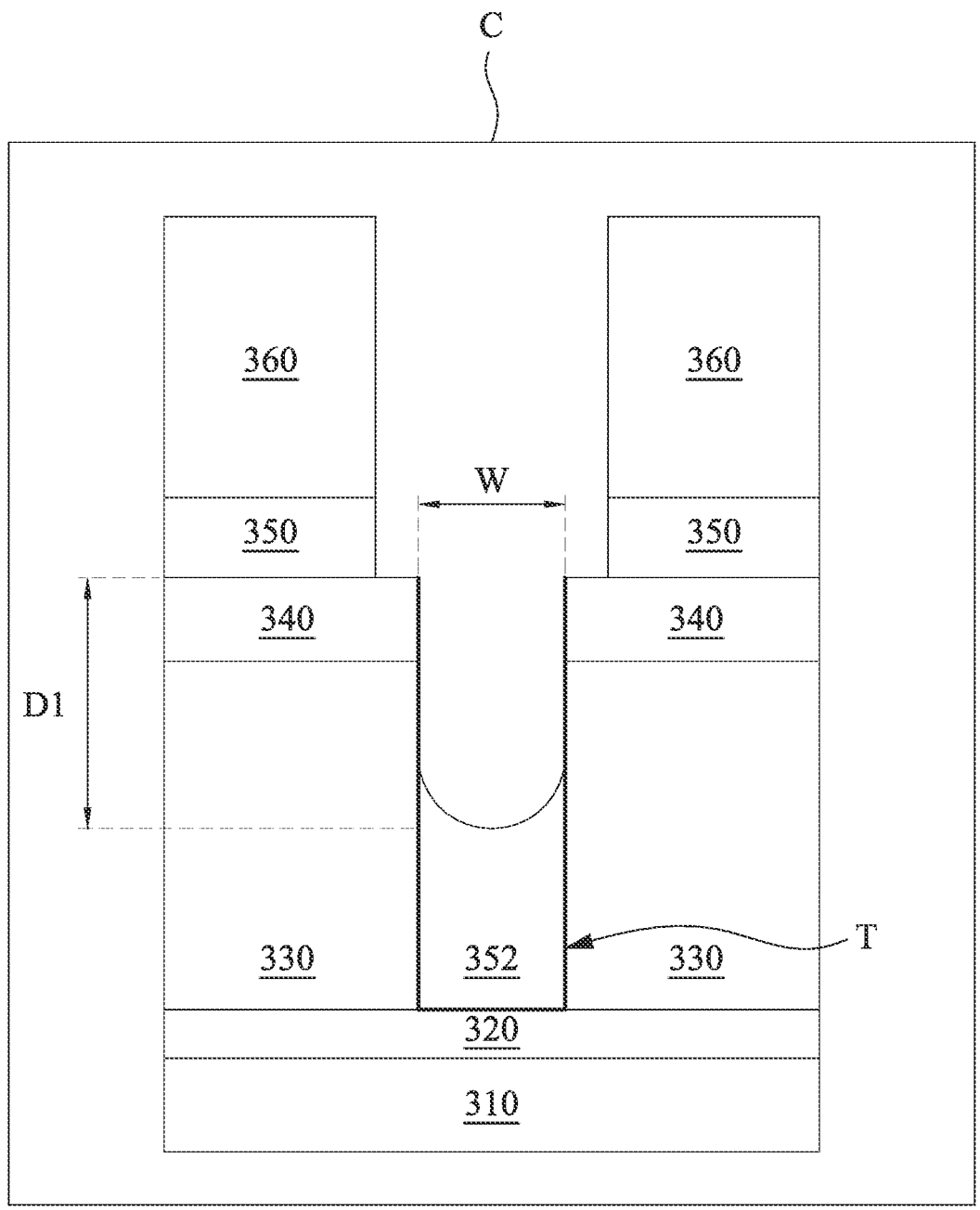
FIG. 4 is a schematic view of an intermediate stage of manufacturing the semiconductor device in accordance with an embodiment of present disclosure.

Reference is made to FIGS. 2, 3, and 4. As shown in FIG. 3, the stacking structure including the trench T filled with BARC material is placed in the chamber C. The examples of the stacking structure are mentioned above, so the detail thereof will not be described herein. In some embodiments, as shown in FIG. 3, the stacking structure may include the recess R, but the present disclosure is not limited in this regard.

Reference is made to FIGS. 2 and 4. The first etching process is performed in step S121 to etch the dummy via 352 of the stacking structure. Specifically, the first etching process is performed using a first etching gas flowed into the chamber C to etch a first portion of the dummy via 352 with a depth D1, as shown in FIG. 4. For example, the first etching process is performed as a splitting step of the etching of the dummy via 352 in the trench T.

In some embodiments, the first etching gas used in step S121 includes $CHF_3$ and $O_2$. For example, $CHF_3$ and $O_2$ are used as precursors to etch the first portion of the dummy via 352.

In some embodiments, the $CHF_3$ is used as the precursor to provide a protecting substance on a sidewall of the trench T. For example, the protecting substance may be polymer formed by a chemical reaction of $CHF_3$ on the surface of the trench T.

In some embodiments, the $O_2$ is used as a precursor to enhance the efficiency of etching downward the dummy via 352.

In some embodiments, a volume ratio of $CHF_3$ to $O_2$ is 3:1. This volume ratio of $CHF_3$ to $O_2$ mainly ensures that the dummy via 352 is etched downward with the depth D1, and also additionally ensures the critical dimension, a width W of the etched first portion of the dummy via 352 can be maintained.

In some embodiments, the volume ratio of $CHF_3$ to $O_2$ allows the first etching process in step S121 to etch downward only, and also allows the formed polymer to exactly provide a protection of the sidewall of the trench T, thereby avoiding the fencing problem caused by the different etch selectivity between the dielectric layer 330 and the dummy via 352.

In Step S122, a second etching process is performed to maintain a critical dimension of the dummy via.

Reference is made to FIGS. 2 and 5. The second etching process is performed in step S122 to maintain the critical dimension of the dummy via 352. Specifically, the second etching process is performed using a second etching gas flowed into the chamber C to maintain the critical dimension of the dummy via 352 with a width W. Additionally, the second etching process is performed using the second etching gas flowed into the chamber C to etch a second portion of the dummy via 352 with a depth D2, as shown in FIG. 5. For example, the second etching process is performed as a splitting step of the etching of the dummy via 352 in the trench T.

In some embodiments, the second etching gas used in step S122 includes $H_2$ and $N_2$. For example, $H_2$ and $N_2$ are used as precursors to etch the second portion of the dummy via 352.

In some embodiments, the $H_2$ and $N_2$ are used as the precursors to provide a protecting substance on a sidewall of the trench T. For example, the protecting substance may be polymer formed by a chemical reaction of $H_2$ and $N_2$ on the surface of the trench T.

In some embodiments, a volume ratio of $H_2$ to $N_2$ is 1:1. This volume ratio of $H_2$ to $N_2$ mainly ensures that the critical dimension, the width W of the etched second portion of the dummy via 352 can be maintained, and also ensures the dummy via 352 to be etched downward with the depth D2.

In some embodiments, the volume ratio of $H_2$ to $N_2$ allows the second etching process in step S122 to etch downward and more slowly, and also allows the formed polymer to exactly provide the protection of the sidewall of the trench T, thereby avoiding the fencing problem caused by the different etch selectivity between the dielectric layer 330 and the dummy via 352.

In some embodiments, a first etch rate of the dummy via 352 during the first etching process in step S121 is greater than a second etch rate of the dummy via 352 during the second etching process in step S122. Therefore, in some embodiments, the depth D1 is greater than depth D2.

After performing the step S121 and step S122, the dummy via 352 may be etched with a total depth including the depth D1 and the depth D2 and has a height H, in which the width W of the dummy via 352 remains almost constant during the step S121 and step S122.

In some embodiments, the height H of the dummy via 352 after the first etching process in the step S121 and the second etching process in the step S122 are performed is equal to or less than about 200 nm. The present disclosure is not intended to limit the height H of the dummy via 352.

By performing the method 100 shown in FIG. 2 of the present disclosure, the semiconductor device 300 with better electrical performance may be formed.

In some embodiments, since the method 100 shown in FIG. 2 includes two steps of etching, the semiconductor device 300 formed by the method 100 shown in FIG. 2 has a higher quality than the semiconductor device 300 formed by the method 100 shown in FIG. 1.

In some embodiments, the method 100 shown in FIG. 1 and method 100 shown in FIG. 2 are more appropriately used for forming the semiconductor device 300 including the dummy via 352 without reaming (i.e., avoiding the expansion of the width W of the trench T). More specifically, for example, each of the dummy via 352 has the height H and the width W, but the present disclosure is not limited thereto.

In some embodiments, $CHF_3$ and $O_2$ are used as precursors in step S121 for effectively reducing the height H of the dummy via 352. The present disclosure is not intended to limit the types of the precursors utilized in step S121.

In some embodiments, $H_2$ and $N_2$ are used as precursors in step S122 for less effectively reducing the height H of the dummy via 352 and maintain the critical dimension of the dummy via 352. The present disclosure is not intended to limit the types of the precursors utilized in step S122.

In some embodiments, the first etching process in step S121 is performed before the second etching process in step S122, but the present disclosure is not limited in this regard. In some other embodiments, the first etching process in step S121 may be performed after the second etching process in step S122.

In the embodiments of the present disclosure, the method of manufacturing the semiconductor device solves the fencing problem of the conventional method during M2 trench etching, so that the semiconductor device has higher quality dummy vias, thereby reducing resistivity and improving its electrical performance.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of manufacturing a semiconductor device, comprising:

filling a trench of a stacking structure with a bottom anti-reflection coated material to form a dummy via in the trench, wherein the stacking structure comprises a low-k material layer and a cap layer, and the trench runs through the low-k material layer and the cap layer; and etching the dummy via by performing a first etching process and a second etching process different from the first etching process, wherein a width of the trench remains constant from an entrance of the trench to a bottom portion of the trench after performing the first etching process and the second etching process, and wherein the first etching process and the second etching process are performed such that a top surface of the dummy via is lower than a top surface of the low-k material layer and higher than a bottom surface of the low-k material layer.

2. The method of claim 1, wherein performing the first etching process etches a first portion of the dummy via.

3. The method of claim 1, wherein performing the second etching process etches a second portion of the dummy via.

4. The method of claim 1, wherein a height of the dummy via after performing the first etching process and the second etching process is equal to or less than 200 nm.

5. The method of claim 1, wherein performing the first etching process uses a first etching gas.

6. The method of claim 5, wherein the first etching gas comprises $CHF_3$ and $O_2$.

7. The method of claim 6, wherein a volume ratio of $CHF_3$ to $O_2$ is 3:1.

8. The method of claim 1, wherein performing the second etching process uses a second etching gas.

9. The method of claim 8, wherein the second etching gas comprises $H_2$ and $N_2$.

10. The method of claim 9, wherein a volume ratio of $H_2$ to $N_2$ is 1:1.

11. The method of claim 1, wherein etching the dummy via is performed after filling the trench of the stacking structure.

12. The method of claim 1, wherein the first etching process is performed after the second etching process.

* * * * *